US009601052B2

(12) United States Patent
Jeon (10) Patent No.: US 9,601,052 B2
(45) Date of Patent: Mar. 21, 2017

(54) PIXEL CIRCUIT OF ORGANIC LIGHT-EMITTING DISPLAY

(71) Applicant: Samsung Display Co., Ltd., Yongin, Gyeonggi-do (KR)

(72) Inventor: Mu-Kyung Jeon, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 617 days.

(21) Appl. No.: 14/021,432

(22) Filed: Sep. 9, 2013

(65) Prior Publication Data

US 2014/0320545 A1 Oct. 30, 2014

(30) Foreign Application Priority Data

Apr. 25, 2013 (KR) ........................ 10-2013-0046361

(51) Int. Cl.
*H01L 27/32* (2006.01)
*G09G 3/32* (2016.01)
*H01L 29/786* (2006.01)

(52) U.S. Cl.
CPC ......... *G09G 3/3233* (2013.01); *G09G 3/3291* (2013.01); *H01L 29/78645* (2013.01); *G09G 2300/0814* (2013.01); *G09G 2300/0819* (2013.01); *H01L 27/3262* (2013.01)

(58) Field of Classification Search
CPC ............... G09G 3/3233; G09G 3/3291; G09G 2300/0814; G09G 2300/0819; G09G 3/3241; H01L 29/78645; H01L 27/3262; H01L 29/78675; H01L 27/3244
See application file for complete search history.

(56) References Cited

U.S. PATENT DOCUMENTS

| 7,002,178 B2 | 2/2006 | Chung | |
|---|---|---|---|
| 7,943,934 B2 | 5/2011 | Yoon et al. | |
| 2002/0149053 A1* | 10/2002 | Tsunoda | H01L 27/1214 257/347 |
| 2003/0085401 A1 | 5/2003 | Joo et al. | |
| 2005/0145850 A1* | 7/2005 | Dennison | H01L 27/11 257/72 |

(Continued)

FOREIGN PATENT DOCUMENTS

KR 10-2003-0037876 A 5/2003
KR 10-2003-0081992 A 10/2003

(Continued)

*Primary Examiner* — Amare Mengistu
*Assistant Examiner* — Abhishek Sarma
(74) *Attorney, Agent, or Firm* — Knobbe Martens Olson & Bear LLP (57) ABSTRACT

A pixel of an OLED display is disclosed. A gate voltage of a driving transistor can be precisely adjusted using a second gate electrode that can supply DC power easily securing an operation range of an OLED. Further, by only adding one power line that can precisely adjust a gate voltage of a driving transistor to an OLED display, an operation range of the OLED can be easily secured and thus a drain current can be reduced without increasing a channel length of the driving transistor resulting in a narrower pixel area. According to various embodiments, the pixel can secure an operation range of the OLED by reducing a magnitude of a drain current by adjusting a gate voltage of a driving transistor.

17 Claims, 5 Drawing Sheets

(56) References Cited

U.S. PATENT DOCUMENTS

| | | | |
|---|---|---|---|
| 2011/0148937 A1* | 6/2011 | Park | G09G 3/3233 345/690 |
| 2011/0227885 A1* | 9/2011 | Chung | G09G 3/3241 345/204 |
| 2012/0153289 A1* | 6/2012 | Kaneko | H01L 29/78633 257/59 |

FOREIGN PATENT DOCUMENTS

| | | |
|---|---|---|
| KR | 10-2009-0108976 A | 10/2009 |
| KR | 10-2011-0069397 A | 6/2011 |

* cited by examiner

PIXEL CIRCUIT OF ORGANIC LIGHT-EMITTING DISPLAY

CROSS-REFERENCE TO RELATED APPLICATIONS

This application claims priority to and the benefit of Korean Patent Application No. 10-2013-0046361 filed in the Korean Intellectual Property Office on Apr. 25, 2013, the entire contents of which are incorporated herein by reference.

BACKGROUND

Field

The described technology generally relates to a pixel circuit that is included in an organic light-emitting diode (OLED) display.

Description of the Related Technology

OLED displays are manufactured as a matrix of individual pixel circuits. Each pixel circuit includes an OLED that defines a pixel of a particular color. In order to have grayscales which define a range of color in an OLED, it is generally necessary to have a linear relationship of luminance to current density in the OLED over a wide area of each pixel.

Generally, to have this relationship over a wide area of the pixel, it is necessary to enlarge an operation range of the OLED. To achieve this purpose, lowering a slope of a drain current $I_d$ graph in a saturation area may be used.

In general, a drain current in a saturation area of a transistor is represented by Equation 1.

$$I_d = \frac{1}{2}\frac{W}{L}\mu_n C_{ox}(V_{GS} - V_{TH})^2 \qquad \text{(Equation 1)}$$

Typically, drain currents have been reduced by increasing the channel length L of a driving transistor, largely providing a reasonable range of color in the OLED.

However, when a resolution of a display device increases, a size of a pixel within the display device decreases and thus because the space a pixel circuit can be disposed within decreases, it is difficult to largely secure an operation range of the OLED using a method of increasing a channel length of a driving transistor.

Further, because a channel length cannot be increased with a real RGB method, another technique to lower a slope of a current curved line should be used.

The above information is designed to assist in understanding the disclosed technology and therefore it may contain information that does constitute prior art.

SUMMARY OF CERTAIN INVENTIVE ASPECTS

One inventive aspect is a pixel circuit of an OLED display configured to secure an operation range of an OLED by reducing a magnitude of a drain current by adjusting a gate voltage of a driving transistor.

Another aspect is an OLED display that generates light with an OLED. The OLED display includes: a display unit including a plurality of pixels including at least one thin film transistor (TFT), at least one capacitor, and at least one OLED; a scan driver that transfers a plurality of scanning signals to the display unit; a light emission driver that transfers a plurality of light-emitting signals to the display unit; a data driver that transfers a plurality of data signals to the display unit; a DC power source unit that transfers DC power to the display unit; and a controller that controls the scan driver, the light emission driver, the data driver, and the DC power source unit, wherein a driving transistor that controls a driving current flowing to the OLED among the at least one TFT includes a first gate electrode that receives a supply of a data voltage by one data signal of the plurality of data signals and a second gate electrode that receives a supply of a DC voltage from the DC power source unit.

The first gate electrode and the second gate electrode may be electrically insulated by a second insulation layer, and the second gate electrode and a contact electrode that is connected to the first gate electrode may include a driving transistor that is electrically insulated by a third insulation layer.

The OLED display may further include a driving transistor in which the DC voltage is higher than the data voltage and is supplied to the second gate electrode, when the driving transistor is a p-MOSFET.

The OLED display may further include a driving transistor in which the DC voltage is lower than the data voltage and is supplied to the second gate electrode, when the driving transistor is an n-MOSFET.

The scan driver may supply at least two scanning signals of the plurality of scanning signals to one pixel of the plurality of pixels, supply one data signal of the plurality of data signals to the one pixel according to a first scanning signal of the at least two scanning signals, and supply an initialization voltage to the one pixel according to a second scanning signal of the at least two scanning signals.

The first scanning signal may be supplied to the one pixel after the second scanning signal is supplied to the one pixel.

Another aspect is a pixel that is included in an OLED display. The pixel includes: an OLED; a first transistor that controls a driving current flowing to the OLED; and a second transistor that transfers a data voltage to the first transistor according to a scanning signal, wherein the first transistor includes a first gate electrode that is connected to the second transistor and a second gate electrode that is connected to a DC power source.

The first gate electrode and the second gate electrode may be electrically insulated by a second insulation layer, and the second gate electrode and a contact electrode that is connected to the first gate electrode may include a first transistor that is electrically insulated by a third insulation layer.

The pixel may further include a first transistor in which the DC voltage is higher than the data voltage and is supplied to the second gate electrode through the DC power source, when the first transistor is a p-MOSFET.

The pixel may further include a first transistor in which the DC voltage is lower than the data voltage and is supplied to the second gate electrode through the DC power source, when the first transistor is an n-MOSFET.

Another aspect is a transistor that drives an OLED that is included in a pixel of an OLED display. The transistor includes: a polysilicon layer; a first insulation layer that is formed in an upper portion of the polysilicon layer; a first gate electrode that is formed in an upper portion of the first insulation layer; a second insulation layer that is formed in an upper portion of the first gate electrode; and a second gate electrode that is formed in an upper portion of the second insulating layer, wherein the second gate electrode is electrically insulated from the first gate electrode and is connected to a DC power source.

The transistor may further include a third insulation layer that is formed in an upper portion of the second gate electrode.

The second insulation layer may include a first contact hole, the second gate electrode may include an opening, and the third insulation layer may include a second contact hole, and the transistor may include a contact electrode that is connected to the first gate through the first contact hole, the opening, and the second contact hole.

In this way, a gate voltage of a driving transistor can be precisely adjusted using a second gate electrode that can supply DC power, and an operation range of an OLED can be easily secured.

Further, by only adding one power line that can precisely adjust a gate voltage of a driving transistor to an OLED display, an operation range of an OLED can be easily secured and thus a drain current can be reduced without increasing a channel length of the driving transistor resulting in a narrower pixel area.

DETAILED DESCRIPTION OF CERTAIN INVENTIVE EMBODIMENTS

In the following detailed description, only certain exemplary embodiments of the described technology have been shown and described, simply by way of illustration. As those skilled in the art would realize, the described embodiments may be modified in various different ways, all without departing from the spirit or scope of the described technology. Accordingly, the drawings and description are to be regarded as illustrative in nature and not restrictive. Like reference numerals designate like elements throughout the specification.

Further, like reference numerals designate like elements in several exemplary embodiments and are representatively described in the first exemplary embodiment and elements different from those of the first exemplary embodiment will be described in other exemplary embodiments.

Further, in the drawings, a size and thickness of each element are represented to facilitate understanding and for ease of description, and the present invention is not limited thereto. In the disclosed embodiments, "connected" covers electrical connection.

In the drawings, the thickness of layers and regions may be exaggerated for clarity. In the drawings, in order to facilitate understanding and for ease of description, thicknesses of some layers and areas are exaggerated. When it is said that any part, such as a layer, film, region, or plate, is positioned on another part, it means the part is directly on the other part or above the other part with at least one intermediate part.

In addition, unless explicitly described to the contrary, the word "comprise" and variations such as "comprises" or "comprising", will be understood to imply the inclusion of stated elements but not the exclusion of any other elements.

Further, in the specification, the description of an upper part of a target portion indicates an upper part or a lower part of a target portion, and does not mean that the target portion is always positioned at the upper side based on a direction of gravity.

Figure 1:
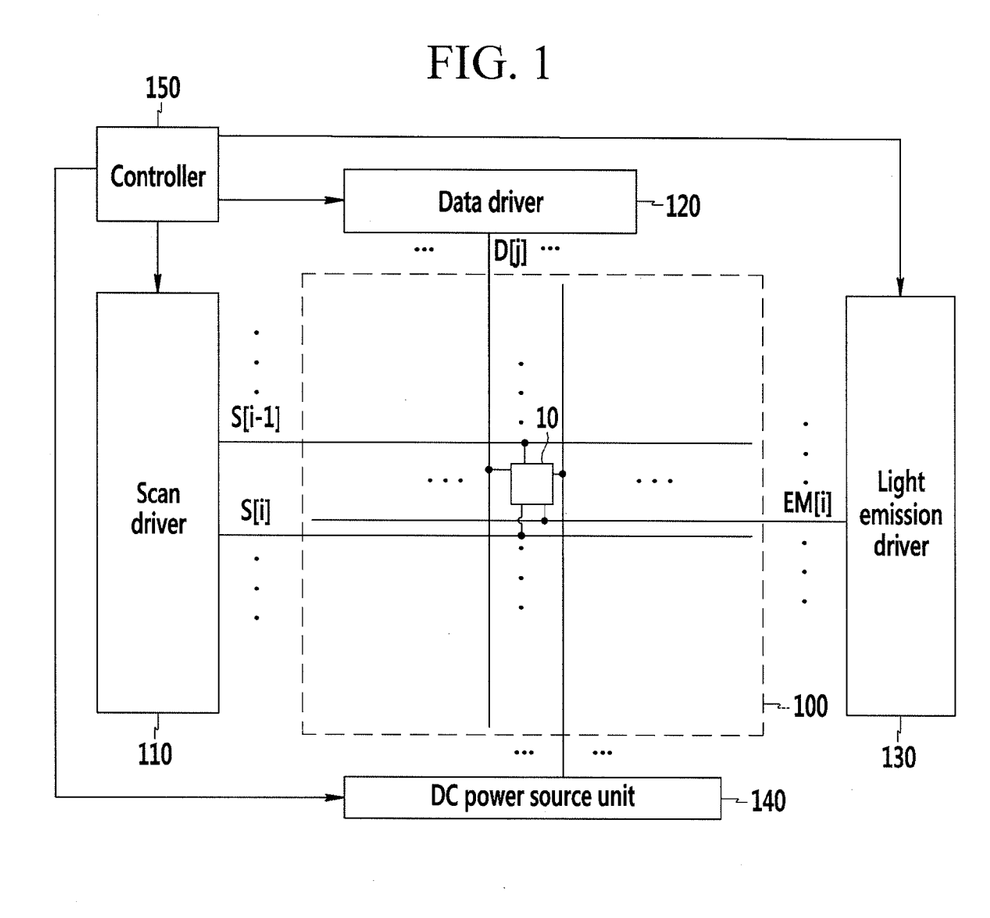
FIG. 1 is a diagram illustrating an OLED display.

FIG. 1 is a diagram illustrating an OLED display.

Referring to FIG. 1, an OLED display includes a display unit 100 including a plurality of pixels 10, a scan driver 110, a data driver 120, a light emission driver 130, a DC power source unit 140, and a controller 150.

The pixel 10 that is included in the display unit 100 can receive a scanning signal from the scan driver 110 through two scan lines of a plurality of scan lines.

The pixel 10 can receive a data signal from the data driver 120 through one data line of a plurality of data lines and can receive a second data signal from the light emission driver 130 through one light emission control line of a plurality of light emission control lines.

In an exemplary embodiment of FIG. 1, the pixel 10 is connected to a scan driver through scan lines S[i−1] and S[i], is connected to the data driver 120 through a data line D[j], and is connected to the light emission driver 130 through a light emission control line EM[i].

In this case, in an OLED display, the pixel 10 receives a DC voltage through the DC power source unit 140. This case will be described in detail with reference to FIGS. 2 to 5.

The controller 150 can receive a video signal, a synchronization signal, and a clock signal from the outside and can transfer a control signal to the scan driver 110, the data driver 120, the light emission driver 130, and the DC power source unit 140.

Figure 2:
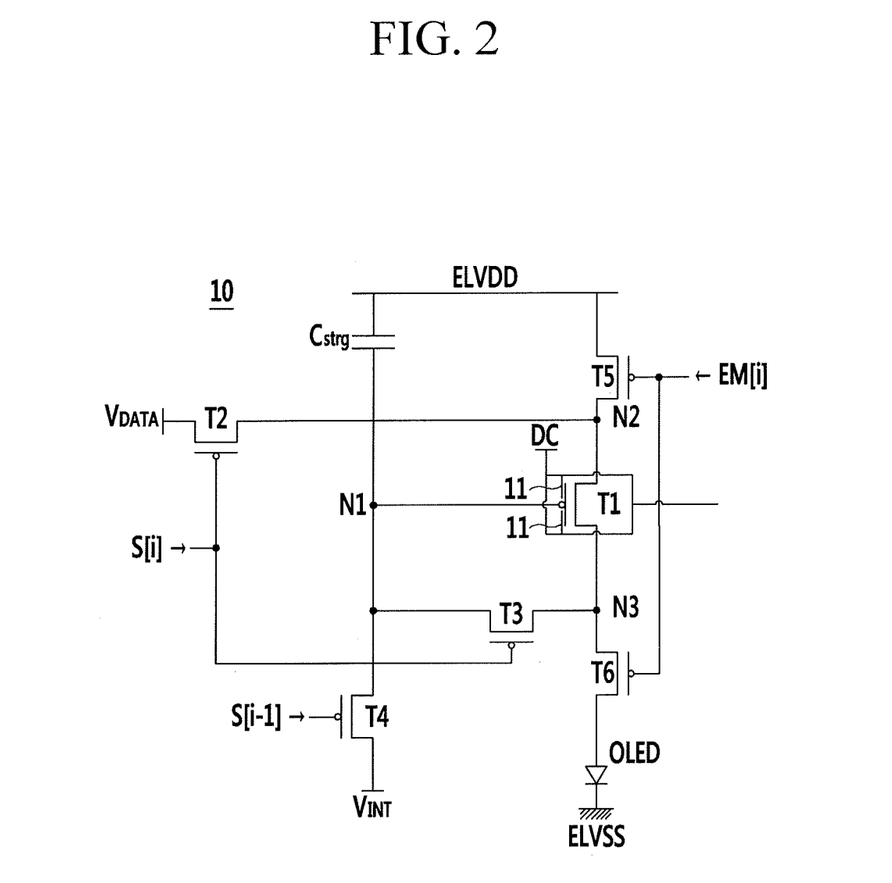
FIG. 2 is a circuit diagram illustrating a circuit of a 6-transistor and 1-capacitor pixel.
Figure 3:
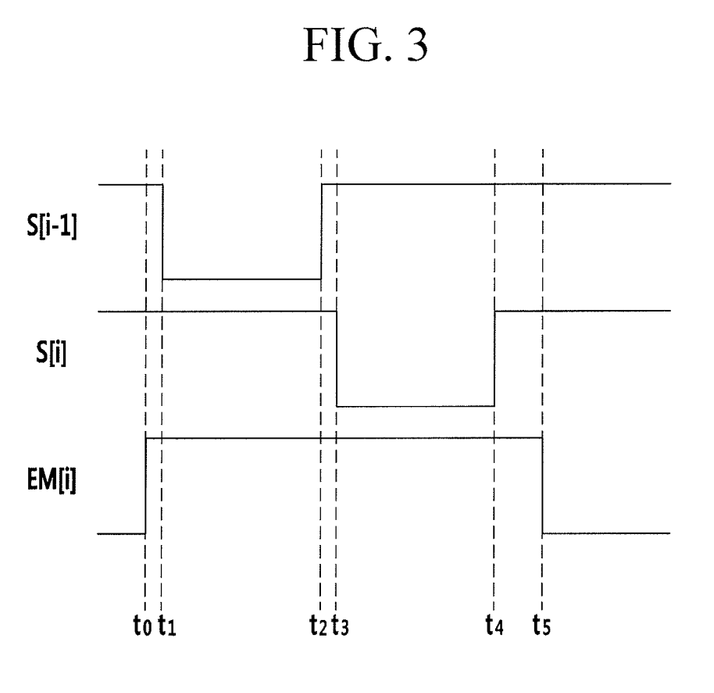
FIG. 3 is a timing diagram illustrating operation of a 6-transistor and 1-capacitor pixel.

FIG. 2 is a circuit diagram illustrating a circuit of a 6-transistor and 1-capacitor pixel, and FIG. 3 is a timing diagram illustrating operation of a 6-transistor and 1-capacitor pixel.

Referring to FIG. 2, the pixel 10 includes an OLED that is connected between a first power source ELVDD and a second power source ELVSS. 6 thin film transistors (TFT) and one capacitor that are positioned between the OLED and the first power source ELVDD to control a driving current to be supplied to the OLED.

In some embodiments, each pixel 10 that is included in the OLED display includes a TFT. Further, a transistor T1 of a TFT that is included in the pixel 10 further includes a second gate electrode 11 in which DC power is separately supplied by the DC power source unit 140, unlike other transistors.

In general, a gate voltage of a driving transistor is determined according to a voltage that is transferred through a switching transistor T2 or a voltage that is stored at a storage capacitor $C_{stg}$ and thus it is generally difficult to artificially control operational characteristics of the driving transistor from the outside of the pixel.

According to an exemplary embodiment of the described technology, the second gate electrode 11 that is further included in the driving transistor separately receives a supply of DC power to function as a kind of resistor, and thus the second gate electrode 11 easily controls operation of the driving transistor from the outside of the pixel. A function and operation of the second gate electrode 11 will be described in detail with reference to FIGS. 4 and 5.

A first scan line and a second scan line are connected to a pixel. In FIG. 2, the scan line S[i] corresponds to the first scan line, and the scan line S[i−1] corresponds to the second scan line.

In some embodiments, the first transistor T1 is a driving transistor that enables flow of a current to the OLED, and the second transistor T2 is a switching transistor that receives a first scanning signal from the first scan line to transfer a data voltage to a driving transistor.

In order to compensate a threshold voltage $V_{th-}$ of the driving transistor, a third transistor T3 is a transistor that enables a diode-connection of the driving transistor. A fourth transistor T4 is an initialization transistor that transfers an initialization voltage $V_{INT}$ for an initialization period.

A fifth transistor T5 and a sixth transistor T6 are a light emission control transistor and receive a light emission control signal from the light emission driver 130 to control operation of the driving transistor. The OLED generates a predetermined luminance of light corresponding to a driving current supplied by the driving transistor.

Hereinafter, operation of the pixel circuit of FIG. 2 will be described in detail with reference to a timing diagram of FIG. 3.

At a time point $t_0$, when a light emission control signal rises to a high level, the fifth transistor T5 and the sixth transistor T6 are turned off. Accordingly, a driving current supplied to the OLED is blocked.

Thereafter, a time point $t_1$, when the second scanning signal S[i-1] falls to a low level, the fourth transistor T4 is turned on, and an initialization voltage $V_{INT}$ is thus supplied to a gate of the driving transistor. That is, a gate voltage $V_G$ of the driving transistor is reset to the initialization voltage $V_{INT}$.

Thereafter, at a time point $t_2$, when the second scanning signal S[i-1] rises to a high level, and at a time point $t_3$, when the first scanning signal S[i] falls to a low level, the second transistor T2 and the third transistor T3 are turned on.

In this case, a data voltage $V_{DATA}$ is transferred to a source electrode N2 of the driving transistor through the second transistor T2, and the third transistor T3, which has been turned on, forms diode connection in which a gate and a drain of the driving transistor are connected. Thereafter, a voltage that is subtracted by a threshold voltage of the driving transistor from a data voltage that is supplied to the source of the driving transistor is supplied to one electrode of the capacitor $C_{strg}$. Therefore, the capacitor $C_{strg}$ is charged with a voltage ELVDD-($V_{DATA}$-$V_{TH}$) corresponding to a difference between the first power source ELVDD and a voltage $V_{DATA}$-$V_{TH}$, that is a threshold voltage subtracted from the data voltage.

Thereafter, at a time point $t_4$, when the first scanning signal S[i] rises to a high level, and at a time point $t_5$, when a light emission control signal EM[i] falls to a low level, the fifth transistor T5 and the sixth transistor T6 are turned on. Because the fifth and sixth transistors T5 and T6, which are a light emission control transistor are turned on, a driving current is transferred to the OLED by a voltage that is stored at the capacitor $C_{strg}$, and the OLED emits light.

Figure 4:
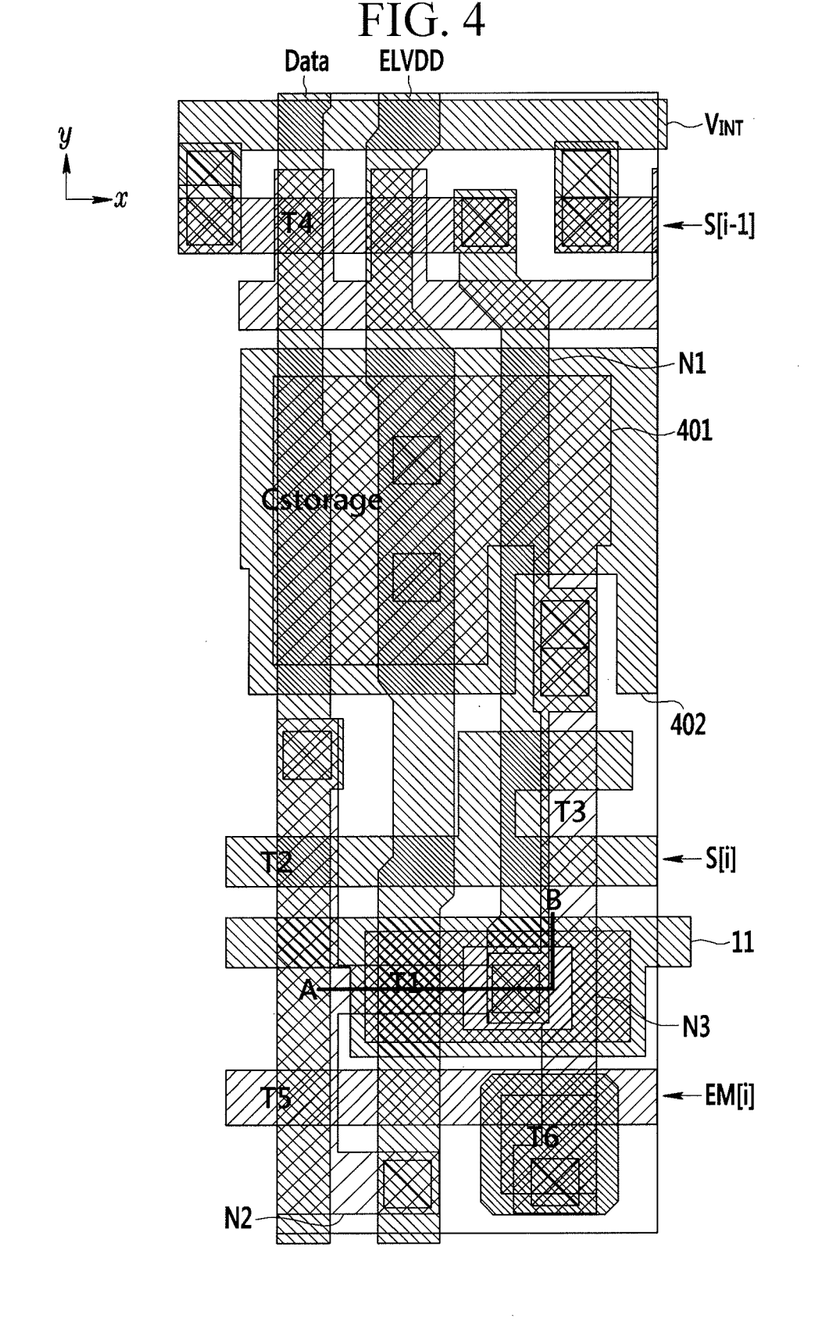
FIG. 4 is a top plan view illustrating a 6-transistor and 1-capacitor pixel.
Figure 5:
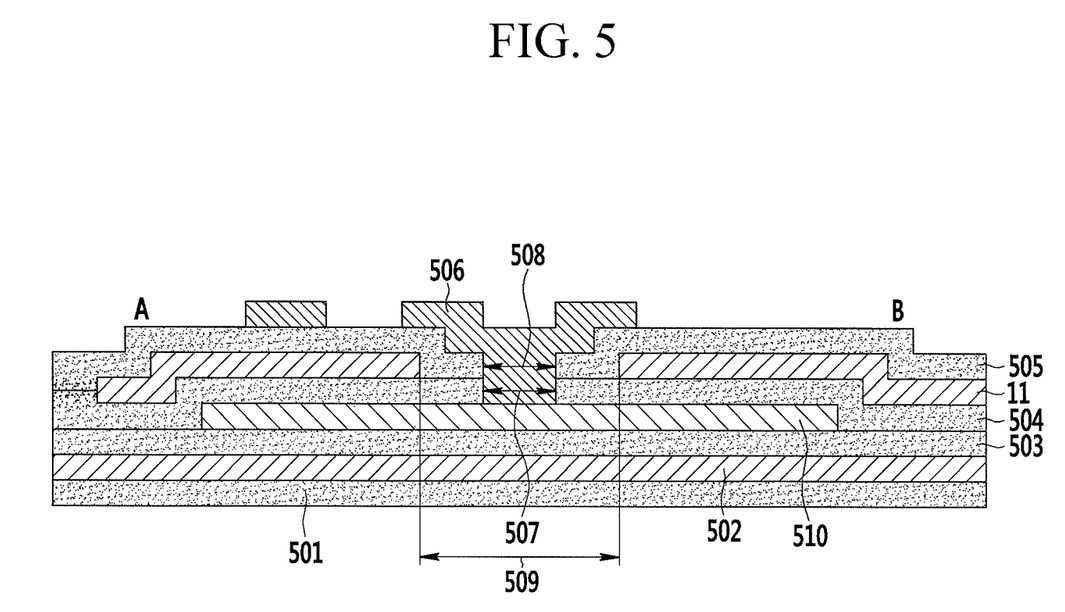
FIG. 5 is a cut-away cross-sectional view illustrating the pixel taken along line A-B of FIG. 4.

FIG. 4 is a top plan view illustrating a 6-transistor and 1-capacitor pixel, and FIG. 5 is a cut-away cross-sectional view taken along line A-B illustrating the pixel of FIG. 4.

FIG. 4 is a top plan view of a pixel in which a circuit diagram of FIG. 2 may be embodied. Referring to FIG. 4, an initialization voltage $V_{INT}$ is supplied in an x-direction to a pixel, and the first scanning signal S[i], the second scanning signal S[i-1], and the light emission control signal EM[i] are transferred to the pixel. Further, the first power source ELVDD and the data voltage $V_{DATA}$ are supplied in a y-direction.

Referring to FIGS. 2 and 4, one electrode 402 of the capacitor $C_{strg}$ is connected to the first power source ELVDD in a first conductive area COA1, and another electrode 401 is connected to N1 in a second conductive area COA2.

Further, one of a source or a drain of the third transistor T3, a source of the fourth transistor T4, and a gate of the first transistor T1 share N1.

Further, a source of the first transistor T1, a drain of the second transistor T2, and a drain of the fifth transistor T5 share N2.

Finally, one of a source or a drain of the third transistor T3 different from the one that is connected to the node N1, a drain of the first transistor T1, and a source of the sixth transistor T6 share N3.

In some embodiments, as shown in FIG. 4, N1, N2, and N3 are a polysilicon layer 502 (shown in FIG. 5) of the transistor, and impurities (electrons or holes) are doped to be used as a source or a drain of the transistor. Further, in an upper portion of the polysilicon layer 502, conductive areas COA1 and COA2 are formed.

In FIG. 4, the OLED and the second power source ELVSS are not shown, but the sixth transistor T6 is connected to the OLED, and thus until the sixth transistor T6 is turned on, a driving current is supplied from the driving transistor.

Referring to FIG. 4, a pixel includes a second gate electrode 11 to which a DC voltage is directly supplied.

Since the second gate electrode 11 covers a first gate electrode 510 of the driving transistor and encloses a contact electrode 506, the second gate electrode 11 is electrically insulated from the contact electrode 506. In this case, a portion in which the first gate electrode 510 and the second gate electrode 11 are not overlapped may be optimized according to a process.

In some embodiments, since a DC voltage is directly supplied to the second gate electrode 11 by a DC power source unit, the second gate electrode 11 functions as a kind of resistor between a gate and a drain of a driving transistor, and a magnitude of a driving current is artificially adjusted from the outside of a pixel.

Hereinafter, operation of a driving transistor including the second gate electrode 11 will be described in detail with reference to FIG. 5.

FIG. 5 is a cut-away cross-sectional view illustrating the pixel taken along line A-B of FIG. 4.

Referring to FIG. 5, a driving transistor includes a buffer insulation layer 501, a polysilicon layer 502 in which electrons or holes are doped, a first insulation layer 503, a first gate electrode 510, a second insulation layer 504, a second gate electrode 11, a third insulation layer 505, a contact electrode 506, a first contact hole 507, a second contact hole 508, and an opening 509. In a process of manufacturing a driving transistor, for example, a driving transistor may include forming the first gate electrode 510 in an upper portion of the first insulation layer 503 and forming the second insulation layer 504.

After the second gate electrode 11 is formed in an upper portion of the second insulation layer 504, the opening 509 is formed by selectively etching an area from the second gate electrode 11, in which the contact electrode 506 is to be inserted.

Thereafter, in an upper portion of the selectively removed second gate electrode 11, the third insulation layer 505 is formed. Thereafter, by partially etching the second insulation layer 504 and the third insulation layer 505, the first contact hole 507 and the second contact hole 508 are formed.

In this case, by inserting the contact electrode 506 into an etched portion, a voltage is supplied to the first gate electrode 510 through the contact electrode 506. That is, the contact electrode 506 is connected to the first gate electrode 510 through the first contact hole 507, the opening 509, and the second contact hole 508.

The second gate electrode 11 is electrically insulated from the first gate electrode 510 by the second insulation layer 504 and is electrically insulated from the contact electrode 506 by the third insulation layer 505.

In the foregoing description, a process of manufacturing a driving transistor has been described, however, a method of manufacturing a driving transistor of the described technology is not limited to the above-described method.

According to an exemplary embodiment of the described technology, the first gate electrode 510 receives a supply of a voltage from the contact electrode 506, and the second gate electrode 11 independently receives a supply of a voltage from the DC power source unit 140, and thus when using the second gate electrode 11, a gate voltage of a driving transistor may be formed regardless of a voltage of the first gate electrode 510.

That is, by supplying a DC voltage to the second gate electrode 11, a resistive effect can be obtained between a gate and a drain of the driving transistor and thus a drain current $I_d$ may be reduced largely securing an operation range of an OLED without increasing a channel length of the driving transistor.

In one embodiment, when the driving transistor is a p-MOSFET, if the driving transistor is operated, a DC voltage higher than a voltage that is supplied to the first gate electrode 510 is supplied to the second gate electrode 11 and thus the drain current $I_d$ of the driving transistor may be reduced.

In another embodiment, when the driving transistor is an n-MOSFET, if the driving transistor is operated, a DC voltage lower than a voltage that is supplied to the first gate electrode 510 is supplied to the second gate electrode 11 and thus the drain current $L_d$ of the driving transistor may be reduced.

In these embodiments, a voltage that is supplied to the second gate electrode 11 may be supplied according to whether the driving transistor is a p-MOSFET or an n-MOSFET and a magnitude of a supply voltage is changed according to a design condition.

According to at least one of the disclosed embodiments, by including the second gate electrode 11 that may independently supply a DC voltage in a driving transistor, a gate voltage of the driving transistor may be precisely adjusted securing an operation range of the OLED.

Further, by adding one power line that can precisely adjust a gate voltage of the driving transistor to a pixel circuit, an operation range of the OLED can be easily secured and thus the drain current $L_d$ may be reduced without increasing a channel length of the driving transistor resulting in a narrower pixel area. Therefore, a pixel circuit can advantageously embody a high resolution OLED display.

The above description is for illustrative purposes only and is not intended to be limited to the disclosed embodiments, but, on the contrary, is intended to cover various modifications and equivalent arrangements included within the spirit and scope of the accompanying claims.

What is claimed is:

1. An organic light-emitting diode (OLED) display, comprising:
   a display unit comprising a plurality of pixels, wherein each of the pixels comprises at least one thin film transistor (TFT), at least one capacitor, and at least one OLED;
   a scan driver configured to transfer a plurality of scanning signals to the display unit;
   a light emission driver configured to transfer a plurality of light-emitting signals to the display unit;
   a data driver configured to transfer a plurality of data signals to the display unit;
   a DC power source unit configured to transfer direct current (DC) power to the display unit; and
   a controller configured to control the scan driver, the light emission driver, the data driver, and the DC power source unit,
   wherein the at least one TFT comprises a driving transistor configured to control a driving current flowing to the OLED,
   wherein the driving transistor comprises a first gate electrode formed over a first insulation layer and configured to receive a data voltage from the data driver and a second gate electrode configured to receive a DC voltage from the DC power source unit,
   wherein the OLED display further comprises a second insulation layer that is interposed between and in direct physical contact with the first and second gate electrodes,
   wherein a contact electrode is electrically connected to the first gate electrode, wherein the contact electrode is electrically insulated to the second gate electrode by a third insulation layer, wherein a first contact hole is formed in the second insulation layer, wherein a second contact hole is formed in the third insulation layer, and wherein a portion of the contact electrode is inserted into the first and second contact holes and is in direct physical contact with the first gate electrode.

2. The OLED display of claim 1, wherein the driving transistor is a p-MOSFET, and wherein the DC voltage supplied to the second gate electrode of the driving transistor is higher than the data voltage.

3. The OLED display of claim 1, where the driving transistor is an n-MOSFET and wherein the DC voltage supplied to the gate electrode of the driving transistor is lower than the data voltage.

4. The OLED display of claim 1, wherein the scan driver is configured to i) supply at least two of the scanning signals to one of the pixels, wherein the at least two scanning signals comprise first and second scanning signals, ii) supply one of the data signals to the one pixel according to the first scanning signal, and iii) supply an initialization voltage to the one pixel according to the second scanning signal.

5. The OLED display of claim 4, wherein the scan driver is further configured to supply the first scanning signal to the one pixel after the second scanning signal is supplied to the one pixel.

6. The OLED display of claim 1, wherein a first contact hole is formed in the second insulation layer, wherein the driving transistor further comprises a contact electrode that is inserted into the first contact hole and is in direct physical contact with the first gate electrode, and wherein the contact electrode does not directly contact the second gate electrode.

7. A pixel for organic light-emitting diode (OLED) display, the pixel comprising:
   an OLED;
   a first transistor configured to control a driving current flowing to the OLED; and
   a second transistor configured to transfer a data voltage to the first transistor according to a scanning signal,
   wherein the first transistor comprises a first gate electrode formed over a first insulation layer and electrically connected to the second transistor and a second gate electrode electrically connected to a DC power source, wherein the OLED display further comprises a second insulation layer that is interposed between and in direct physical contact with the first and second gate electrodes, wherein the first transistor further comprises a contact electrode that is electrically connected to the first gate electrode wherein the first transistor is electrically insulated b a third insulation layer, wherein a first contact hole is formed in the second insulation layer, wherein a second contact hole is formed in the third insulation layer, and wherein a portion of the contact electrode is inserted into the first and second contact holes and is in direct physical contact with the first gate electrode.

8. The pixel of claim 7, wherein the first transistor is a p-MOSFET, and wherein the DC voltage supplied to the second gate of the first transistor is higher than the data voltage.

9. The pixel of claim 7, wherein the first transistor is an n-MOSFET, and wherein the DC voltage supplied to the second gate of the first transistor is lower than the data voltage.

10. A transistor for driving a pixel of an organic light-emitting diode (OLED) display, the transistor comprising:
a polysilicon layer;
a first insulation layer formed over the polysilicon layer;
a first gate electrode formed over the first insulation layer;
a second insulation layer formed over the first gate electrode; and
a second gate electrode formed over the second insulating layer, wherein the second insulation layer is interposed between and in direct physical contact with the first and second gate electrodes, and
wherein the second gate electrode is electrically insulated from the first gate electrode and is electrically connected to a DC power source,
wherein the second insulation layer comprises a first contact hole, wherein the second gate electrode comprises an opening, wherein the third insulation layer comprises a second contact hole, and wherein the transistor comprises a contact electrode electrically connected to the first gate through the first contact hole, the opening, and the second contact hole.

11. The transistor of claim 10, further comprising a third insulation layer formed over the second gate electrode.

12. A display device, comprising:
a plurality of pixels;
a plurality of data lines comprising first and second data lines; and
a direct current (DC) power source,
wherein each of the pixels comprises at least one thin film transistor (TFT) and at least one organic light-emitting diode (OLED), wherein the at least one TFT comprises a driving transistor configured to control a driving current flowing to the OLED, wherein the driving transistor comprises a first gate electrode formed over a first insulation layer and configured to receive a first data signal from the first data line and a second gate electrode configured to receive a DC voltage from the DC power source, wherein the display device further comprises a second insulation layer that is interposed between and in direct physical contact with the first and second gate electrodes, wherein the driving transistor further comprises a contact electrode that is electrically connected to the first gate electrode, wherein the driving transistor is electrically insulated by a third insulation layer, wherein a first contact hole is formed in the second insulation layer, wherein a second contact hole is formed in the third insulation layer, and wherein a portion of the contact electrode is inserted into the first and second contact holes and is in direct physical contact with the first gate electrode.

13. The display device of claim 12, further comprising at least two scan lines that include first and second scan lines, wherein a source electrode of the driving transistor is configured to receive a second data signal from the second data line according to a first scanning signal received from the first scan line, and wherein the first gate electrode is configured to receive the first data signal according to a second scanning signal received from the second scan line.

14. The display device of claim 13, further comprising:
a data driver configured to apply a plurality of data signals to the data lines;
a scan driver configured to apply a plurality of scan signals to the at least two scan lines, and
a controller configured to control the data driver and the scan driver.

15. The display devices of claim 12, wherein the at least one TFT further comprises a diode connection transistor electrically connected to form a diode connection between a drain electrode of the driving transistor and at least one of the first and second gate electrodes of the driving transistor.

16. The display device of claim 15, wherein the diode connection further comprises:
an electrical connection between a source electrode of the diode connection transistor and the drain electrode of the driving transistor, and
a second electrical connection between a drain electrode of the diode connection transistor and the at least one gate electrode of the driving transistor.

17. The display device of claim 15, wherein the diode connection further comprises:
an electrical connection between a drain electrode of the diode connection transistor and the drain electrode of the driving transistor, and
a second electrical connection between a source electrode of the diode connection transistor and the at least one gate electrode of the driving transistor.

* * * * *